(12) United States Patent  (10) Patent No.: US 8,235,734 B2
Ju                          (45) Date of Patent:     Aug. 7, 2012

(54) ELECTRICAL CONNECTOR

(75) Inventor: Ted Ju, Keelung (TW)

(73) Assignee: Lotes Co., Ltd, Keelung (TW)

( * ) Notice: Subject to any disclaimer, the term of this patent is extended or adjusted under 35 U.S.C. 154(b) by 0 days.

(21) Appl. No.: 13/045,043

(22) Filed: Mar. 10, 2011

(65) Prior Publication Data

US 2012/0178306 A1    Jul. 12, 2012

(30) Foreign Application Priority Data

Jan. 10, 2011 (CN) .................. 2011 2 0007703 U

(51) Int. Cl.
*H01R 12/00* (2006.01)
*H05K 1/00* (2006.01)
(52) U.S. Cl. ........................................................ 439/83
(58) Field of Classification Search .................. 439/83, 439/71, 70, 73
See application file for complete search history.

(56) References Cited

U.S. PATENT DOCUMENTS 6,501,665 B1 * 12/2002 Ted ............................... 361/808
6,702,594 B2 *  3/2004 Lee et al. .......................  439/83

* cited by examiner

*Primary Examiner* — Javaid Nasri
(74) *Attorney, Agent, or Firm* — Morris Manning & Martin LLP; Tim Tingkang Xia, Esq.

(57) ABSTRACT

An electrical connector that includes: an insulating body, having a plurality of receiving holes disposed thereon, a plurality of solder balls, respectively received in one of the receiving holes, a plurality of terminals, in which each terminal has a base correspondingly received in one of the receiving holes, a first extending portion and a second extending portion extend downwards from the base, a first hook extends laterally from an end of the first extending portion, a second hook extends laterally from an end of the second extending portion, and the first hook and the second hook respectively hook a periphery of the solder ball under a horizontal center line of the solder ball.

9 Claims, 5 Drawing Sheets

ELECTRICAL CONNECTOR

CROSS-REFERENCE TO RELATED APPLICATIONS

This non-provisional application claims priority under 35 U.S.C. §119(a) on Patent Application No. 201120007703.9 filed in The People's Republic of China on Jan. 10, 2011, the entire contents of which are hereby incorporated by reference.

FIELD OF THE INVENTION

The present invention relates to an electrical connector, and more particularly to an electrical connector for electrically connecting a chip module to a circuit board.

BACKGROUND OF THE INVENTION

Currently, an electrical connector commonly used in the field includes: an insulating body, disposed with a plurality of receiving holes, a plurality of conductive terminals, in which the conductive terminals each have a base fixed in one of the receiving holes, two ball clamping portions respectively extend from the base towards two sides thereof, and the two clamping portions approach each other in a shape of a circle, and a plurality of solder balls, each correspondingly clamped between the two clamping portions. In the electrical connector, the clamping portions of the conductive terminal for clamping the solder ball are in the shape of a circle, when the conductive terminal is unfolded after impact molding, the two clamping portions occupy a large width, and since the conductive terminals are connected with a material belt, two adjacent conductive terminals on the terminal material must be spaced by a certain distance, and thus the utilization of the terminal material is reduced. Moreover, when assembling the conductive terminals in the receiving holes, a distance of the receiving holes is smaller than a distance between the two adjacent conductive terminals attached on the material belt, such that the conductive terminals in the receiving holes of the same row need to be assembled twice, thus increasing the assembling steps.

In order to solve the above problem, another type of electrical connector is provided in the field, which includes: an insulating body, disposed with a plurality of receiving holes, a plurality of dual-arm conductive terminals, in which the conductive terminals each have a base fixed in one of the receiving holes, two clamping arms extend downwards in parallel from the base to expose out of the insulating body, and a gap exists between the two clamping arms to clamp a solder ball therein. Due to the special structure of the terminal, this type of electrical connector needs to dispose two opposite bumps at a periphery of the receiving hole, so as to cooperate with the two clamping arms of the conductive terminal to limit the solder ball in a horizontal direction and a vertical direction, thus ensuring that the solder ball is clamped at a preset position between the two clamping arms. However, when the electrical connector is reflowed in a reflow oven, the insulating body tends to be warped and deformed under heat, thus losing the clamping and positioning effects on the solder ball, such that the solder ball has a poor soldering effect, even missing solder.

Therefore, a heretofore unaddressed need exists in the art to address the aforementioned deficiencies and inadequacies.

SUMMARY OF THE INVENTION

In one aspect, the invention is directed to an electrical connector that is capable of reducing production cost and has a good soldering effect.

In one embodiment, the present invention has the following inventive measures and provides an electrical connector that includes: an insulating body, having a plurality of receiving holes disposed thereon, a plurality of solder balls, correspondingly received in one of the receiving holes respectively, a plurality of terminals, in which each terminal has a base correspondingly received in one of the receiving holes, a first extending portion and a second extending portion extend downwards from the base, a first hook extends laterally from an end of the first extending portion, a second hook extends laterally from an end of the second extending portion, and the first hook and the second hook respectively hook a periphery of the solder ball under a horizontal center line of the solder ball, such that the solder ball is located between the first hook and the second hook, and the first hook and the second hook are just located at two opposite sides of a vertical center line of the solder ball.

Compared with the related art, among other things, the electrical connector of the present invention is configured such that the first hook and the second hook are formed by extending downwards and then extending laterally from the base, so the distance between the terminals when being unfolded after impact molding is smaller, and thus more terminals can be cut from the terminal material having the same length. Therefore, the terminal material can be used to the maximum extent, thus saving the production cost effectively, and simplifying the assembling steps. The first hook and the second hook are just located at the two opposite sides of the vertical center line of the solder ball, and this structure enables the solder ball to have a better balance performance, thus being firmly hooked in the hooking space without any lateral deviation. As such, the method of disposing two bumps on the insulating body to cooperatively position the solder ball as described in the related art is not required, and it is ensured that the electrical connector has a good soldering effect when being reflowed in the reflow oven without any negative effects such as missing solder. The electrical connector has a simple structure, thus being capable of simplifying the production process and reducing the production cost.

These and other aspects of the present invention will become apparent from the following description of the preferred embodiment taken in conjunction with the following drawings, although variations and modifications therein may be effected without departing from the spirit and scope of the novel concepts of the disclosure.

DETAILED DESCRIPTION OF THE INVENTION

Figure 1:
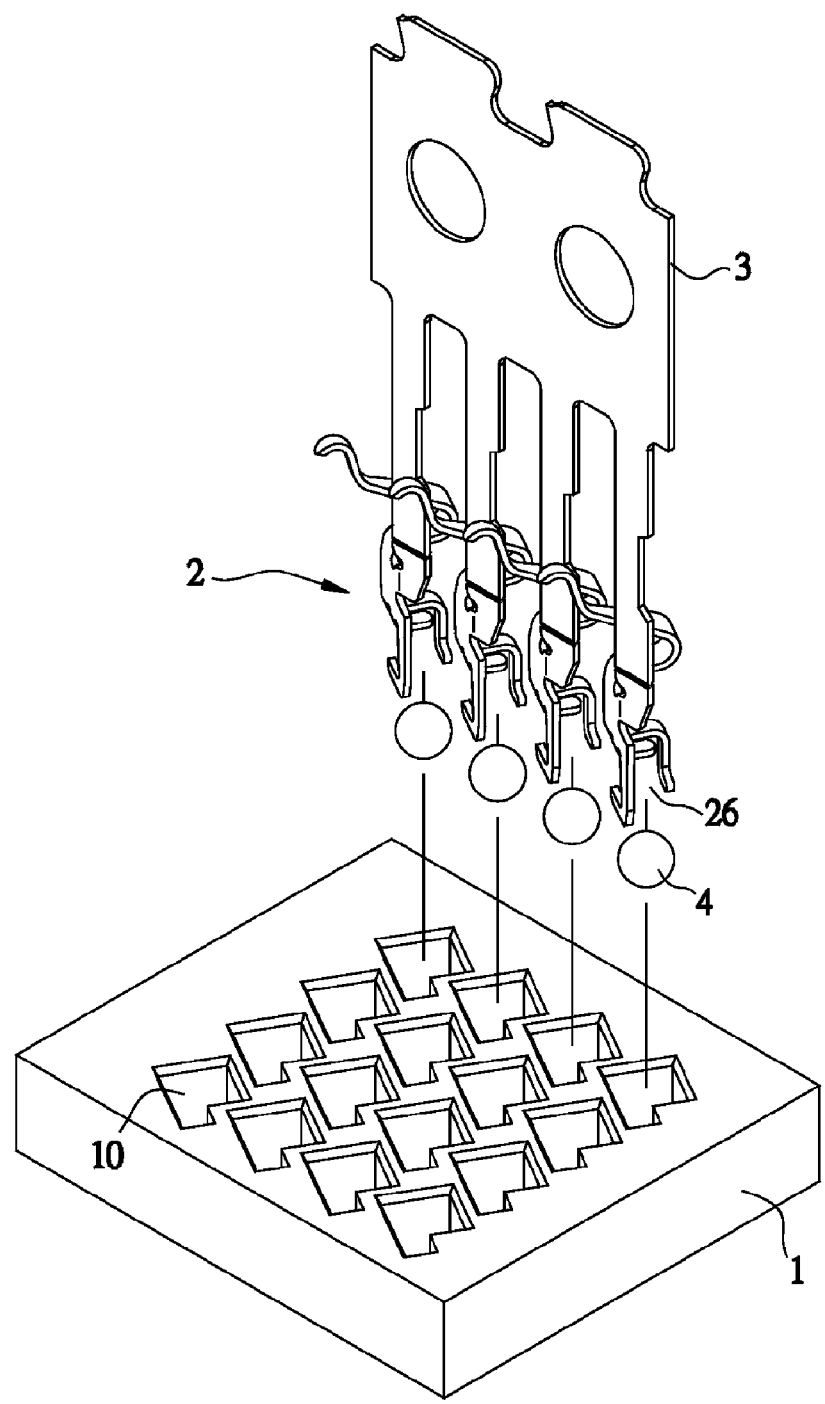
FIG. 1 is an exploded view of an electrical connector according to one embodiment of the present invention.

In order to make the objectives, structure, features and effects of the invention more comprehensible, electronic components and manufacturing methods thereof in the invention are further described below with reference to the accompany drawings and specific embodiments.

The present invention is more particularly described in the following examples that are intended as illustrative only since numerous modifications and variations therein will be apparent to those skilled in the art. Various embodiments of the invention are now described in detail. Referring to the drawings, FIGS. 1-6, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, the terms "comprising," "including," "having," "containing," "involving," and the like are to be understood to be open-ended, i.e., to mean including but not limited to.

A list of reference numerals with corresponding components as shown in the drawings is given below only for the purpose of a reader's convenience.

List of Reference Numerals in the electrical connector according to one or more embodiments of the present invention:

Insulating body 1
Receiving hole 10
Reserved space 100
Terminal 2
Base 20
Elastic arm 21
Contact portion 22
First extending portion 23
Second extending portion 24
First hook 230
Second hook 240
Connecting arm 241
Supporting arm 242
Leaning point 250
Hooking space 26
Hooking point 260
Stopping portion 27
Material belt 3
Solder ball 4

As shown in FIG. 1, an electrical connector according to one embodiment of the invention includes an insulating body 1. The insulating body 1 is opened with a plurality of receiving holes 10, each of the receiving holes 10 correspondingly receives a terminal 2, and a solder ball 4 is secured at a lower part of the terminal 2.

Figure 2:
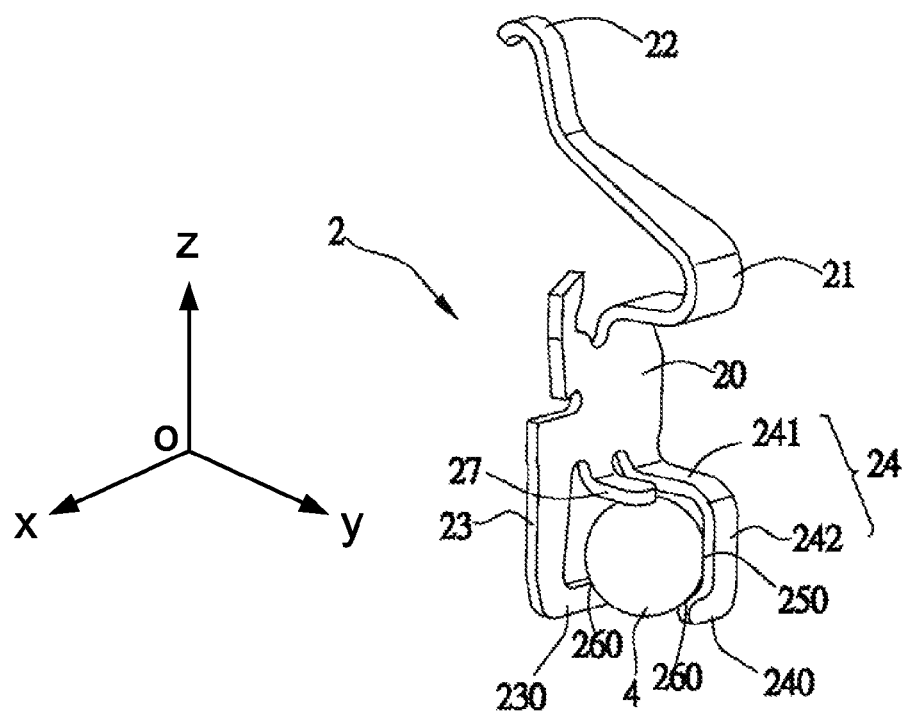
FIG. 2 is a schematic structural view of a terminal hooking a solder ball.

Referring to FIGS. 1 and 2, the terminals 2 in the receiving holes 10 of the same row are attached on one material belt 3. Each of the terminals 2 has a base 20 fixed in the receiving hole 10, an elastic arm 21 is bent upwards and extends from the base 20, and the elastic arm 21 extends upwards continuously to form a contact portion 22.

A first extending portion 23 and a second extending portion 24 extend downwards from the base 20 respectively, a first hook 230 extends laterally from an end of the first extending portion 23, and a second hook 240 extends laterally from an end of the second extending portion 24, in which the first hook 230 and the second hook 240 are located in different vertical planes, and the first hook 230 and the second hook 240 extend in parallel relatively. The first extending portion 23, the second extending portion 24, the first hook 230, and the second hook 240 form a hooking space 26, and each of the solder balls 4 correspondingly enters in the hooking space 26 of one of the terminals 2.

Figure 3:
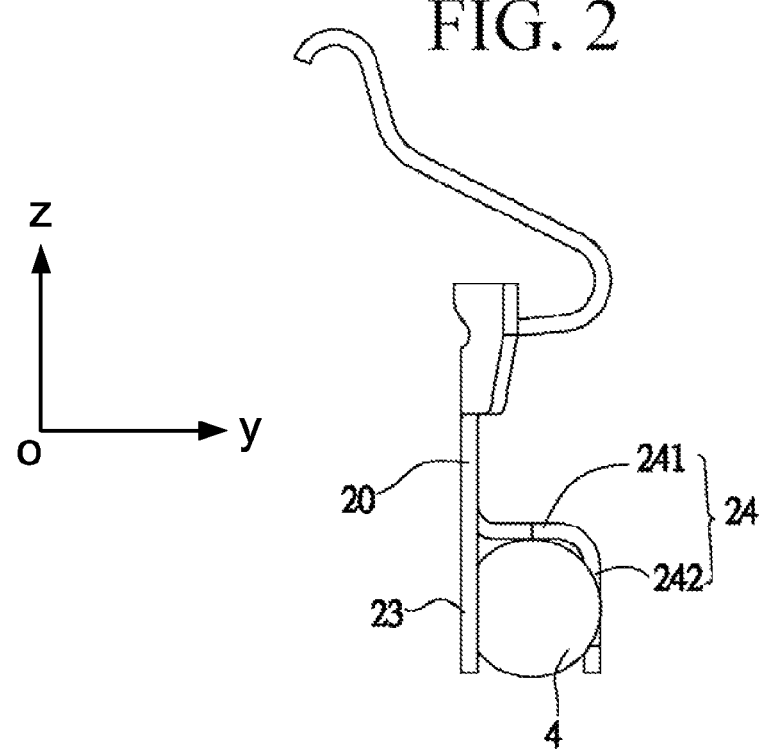
FIG. 3 is a schematic structural view of a terminal hooking a solder ball from another angle of view.
Figure 7:
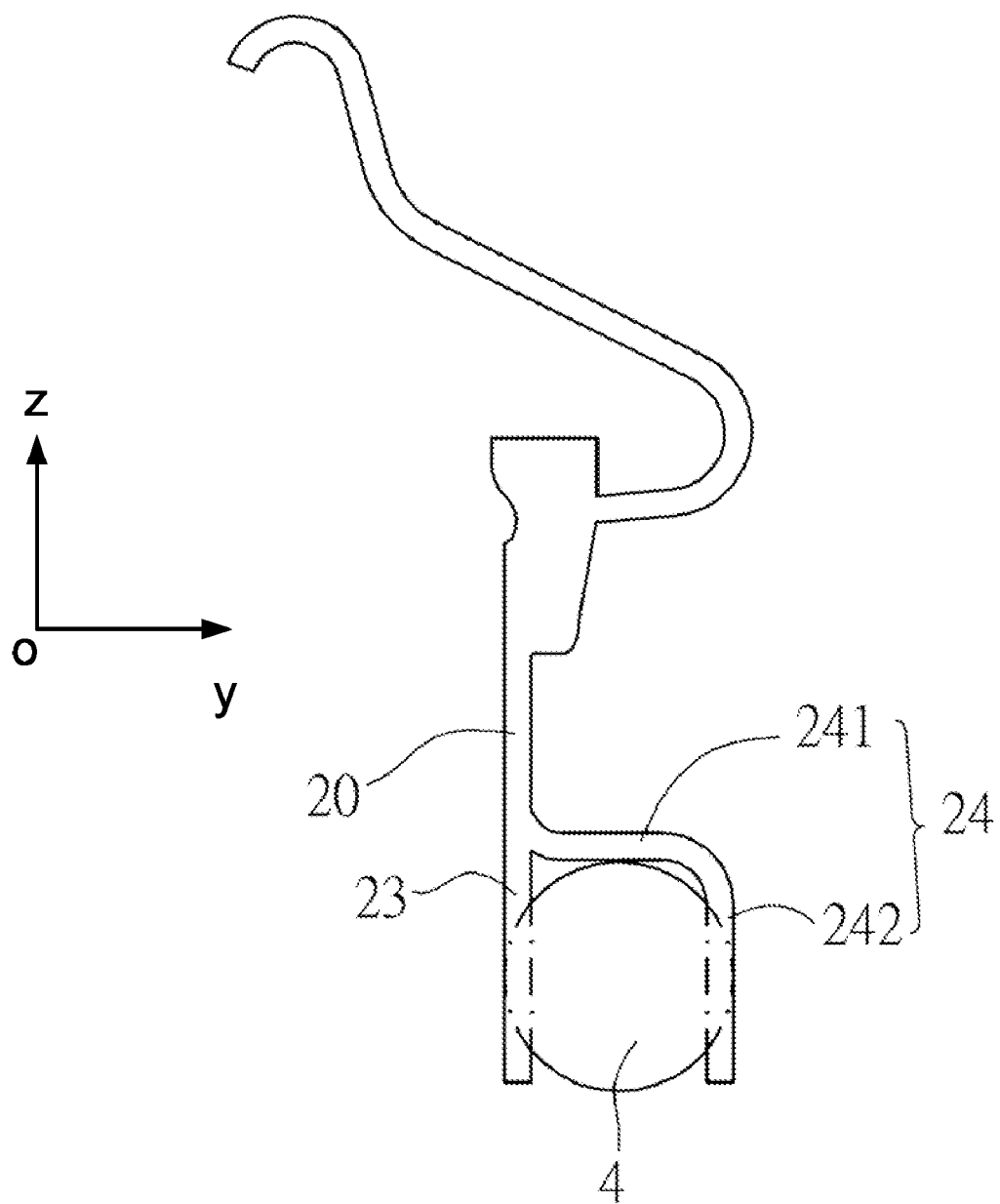
FIG. 7 shows a projection view of a terminal hooking a solder ball from the horizontal xo direction.

Referring to FIG. 2, a perspective view of the terminal 2 is shown and associated with a three-dimensional, xyz coordinator, where the base 20 is in coincident with the xoz plane, a common perpendicular plane of the base 20 is in coincident with the yoz plane, and a horizontal plane is corresponding to the xoy plane. FIG. 3 shows a side view of the terminal 2 from a horizontal xo direction that is perpendicular to the yoz plane (i.e., the common perpendicular plane of the base 20). FIG. 7 shows a projection view of the terminal 2 from the horizontal xo direction. FIGS. 3 and 7 show the views of the terminal 2 from the same xo direction. The former is a structural side view, while the latter is a projection view. As shown in FIGS. 2, 3 and 7, a projection of the first extending portion 23 on the common perpendicular plane of the base 20 is at least partially overlapped with a projection of the solder ball 4 on the common perpendicular plane, a projection of the second extending portion 24 on the common perpendicular plane is at least partially overlapped with the projection of the solder ball 4 on the common perpendicular plane, such that the first extending portion 23 cooperates with the second extending portion 24 to stop and limit the solder ball 4 in the horizontal direction parallel to the horizontal, xoy plane.

Further, the second extending portion 24 includes a connecting arm 241 and a supporting arm 242, the connecting arm 241 extends from a lower end of the base 20 and is perpendicular to a plane of the base 20, the supporting arm 242 is bent downwards and extends from an end of the connecting arm 241, and the supporting arm 242 has a leaning point 250 contacting with the solder ball 4, for stopping the solder ball 4.

Figure 4:
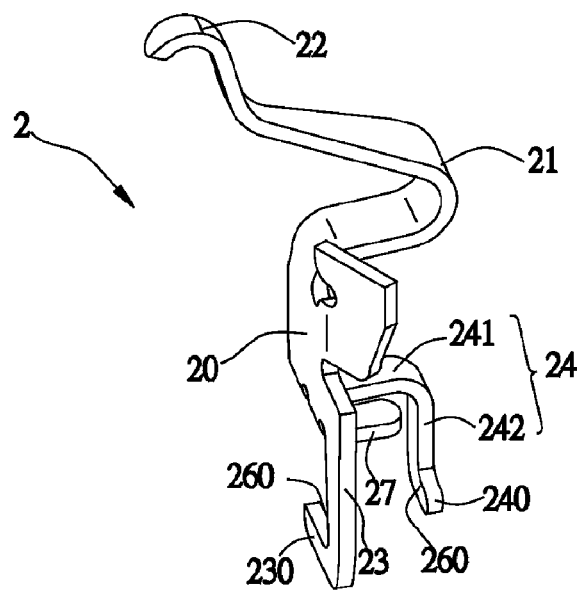
FIG. 4 is a three-dimensional view of a terminal in an electrical connector according to one embodiment of the present invention.

Referring to FIGS. 2-4, the first hook 230 and the second hook 240 each have a hooking point 260 contacting with one point on the periphery of the solder ball 4 under a horizontal center line of the solder ball 4, the first hook 230 and the second hook 240 are just located at two opposite sides of a vertical center line of the solder ball 4, and a line connecting the two hooking points 260 just passes through the vertical center line of the solder ball 4.

Figure 5:
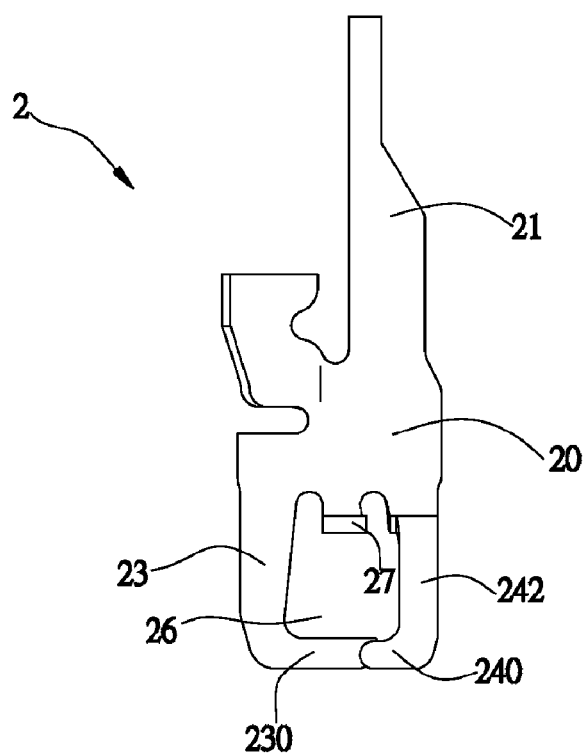
FIG. 5 is a schematic structural view of a terminal from another angle of view.

Referring to FIGS. 4 and 5, in order to avoid the solder ball 4 from over-shifting upwards, a stopping portion 27 extends laterally from the lower end of the base 20, and the stopping portion 27 is located above the solder ball 4 and between the first extending portion 23 and the second extending portion 24.

Figure 6:
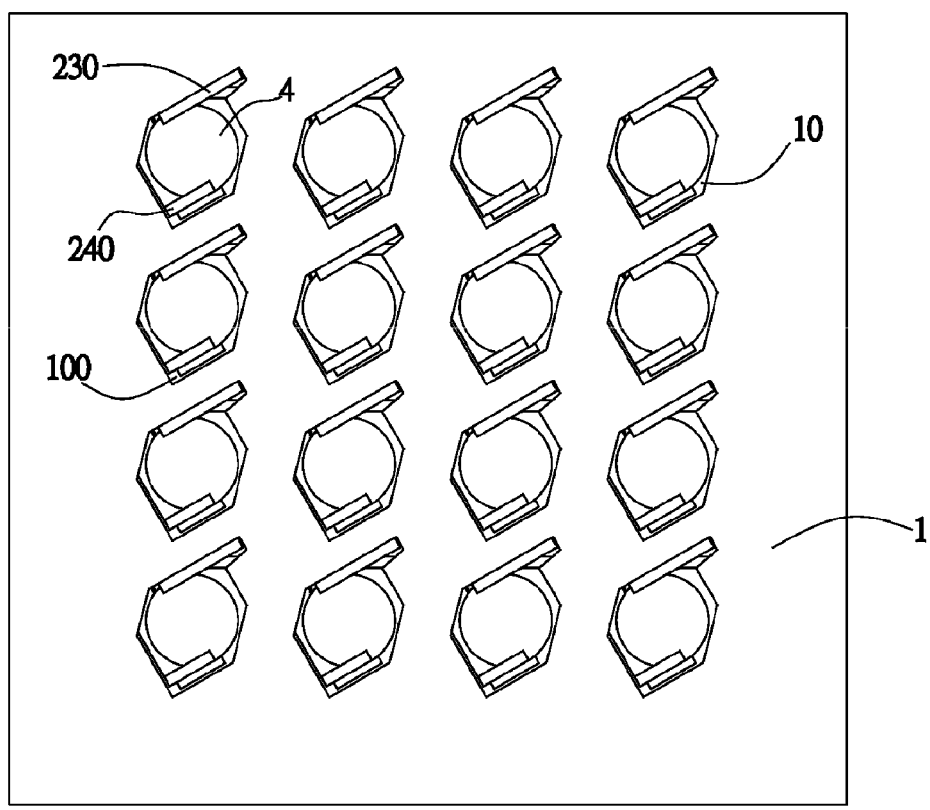
FIG. 6 is a schematic structural view of a bottom of an electrical connector according to one embodiment of the present invention.

Referring to FIG. 6, an inner wall of the receiving hole 10 is not in direct contact with the supporting arm 242 of the terminal 2, and a reserved space 100 is formed therebetween. The reserved space 100 receives the supporting arm 242 when the solder ball 4 stretches the supporting arm 242, such that the supporting arm 242 has a room to move in the receiving hole 10.

When assembling the solder ball 4 in the hooking space 26, a force is applied first to stretch the supporting arm 242, and at this time, the supporting arm 242 shifts in the reserved space 100; the solder ball 4 is then placed in the hooking space 26; the force applied to the supporting arm 242 is released, the supporting arm 242 restores until the leaning point 250 contacts with the solder ball 4, and the second hook 240 cooperates with the first hook 230 to perform positioning to the solder ball 4. After the solder ball 4 enters in the hooking space 26, the first extending portion 23 and the second extending portion 24 may limit the solder ball 4 in the horizontal direction, the two hooking points 260 contact with the solder ball 4, and produce forces vertically upwards to the solder ball 4, so as to support the solder ball 4. At the same time, the two hooking points 260 may also produce forces in opposite directions to clamp the solder ball 4 horizontally.

Based on the above, among other things, the electrical connector according to the invention has the following beneficial effects.

1. The first extending portion 23, the second extending portion 24, the first hook 230, and the second hook 240 are all formed by extending downwards and then extending laterally from the base 20, and thus when the terminal 2 is unfolded after impact molding, a width thereof is rather small, so more terminals 2 may be cut from the terminal material of a certain length, such that the terminal material is used to the maximum extent, thereby effectively saving the production cost, and simplifying the assembling steps.

2. The first hook 230 and the second hook 240 are just located at the two opposite sides of the vertical center line of the solder ball 4, the first hook 230 and the second hook 240 can perform positioning on the solder ball 4, such that the solder ball 4 is not easy to deviate laterally or slide, and therefore, it is unnecessary to dispose two bumps on the insulating body 1 to position the solder ball 4 cooperatively. The electrical connector has a simple yet inventive structure, thus being capable of simplifying the production process and reducing the production cost.

3. The first hook 230 and the second hook 240 each have a hooking point 260 contacting with one point on the periphery of the solder ball 4 under the horizontal center line of the solder ball 4, and the two hooking points 260 produce forces vertically upwards to the solder ball 4, so as to support the solder ball 4. At the same time, the two hooking points 260 may also produce forces in opposite directions to clamp the solder ball 4 horizontally.

4. The two hooking points 260 are respectively in contact with one point on the periphery of the solder ball 4 under the horizontal center line of the solder ball 4, and thus the distance from the first hook 230 to a vertical projection of the center of the solder ball 4 is small, and so is the distance from the second hook 240 to the vertical projection of the center of the solder ball 4. When the terminal 2 is reflowed in the reflow oven, the solder ball 4 gradually melts to become solder paste, and the supporting arm 242 restores along with the gradually reduced volume of the solder ball 4, such that the first hook 230 and the second hook 240 approach to the center of the solder ball 4 more closely (that is to say, the distance between the terminal 2 and the vertical projection of the center of the solder ball 4 becomes smaller and smaller), at this time, an area of the solder paste wrapping the first hook 230, the second hook 240, and the supporting arm 242 is much larger, thus being beneficial to enhance the soldering effect.

5. The projection of the first extending portion 23 on the common perpendicular plane of the base 20 and the horizontal plane is at least partially overlapped with the projection of the solder ball 4 on the common perpendicular plane, and the projection of the second extending portion 24 on the common perpendicular plane is at least partially overlapped with the projection of the solder ball 4 on the common perpendicular plane, such that the second extending portion 24 cooperates with the first extending portion 23 to limit the solder ball 4 in the horizontal direction, and the solder ball 4 is positioned and hooked more stably.

6. The stopping portion 27 is further disposed above the solder ball 4, for stopping the solder ball 4 when the solder ball 4 shifts upwards, thereby preventing the solder ball 4 from leaving the hooking space 26 upwards, thus avoiding the first hook 230 and the second hook 240 from losing the effect of hooking and positioning.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
    an insulating body, having a plurality of receiving holes disposed thereon;
    a plurality of solder balls, correspondingly received in one of the receiving holes respectively; and
    a plurality of terminals, wherein each terminal has a base correspondingly received in one of the receiving holes, a first extending portion, and a second extending portion extend downwards from the base, a first hook extends laterally from an end of the first extending portion, and a second hook extends laterally from an end of the second extending portion, wherein the first hook and the second hook respectively hook a periphery of the solder ball under a horizontal center line of the solder ball, such that the solder ball is located between the first hook and the second hook, and the first hook and the second hook are just located at two opposite sides of a vertical center line of the solder ball.
    wherein the second extending portion comprises a connecting arm and a supporting arm, the connecting arm extends from a lower end of the base and forms an angle with a plane of the base, and the supporting arm is bent downwards and extends from an end of the connecting arm.

2. The electrical connector according to claim 1, wherein a projection of the first extending portion on a common perpendicular plane of the base is at least partially overlapped with a projection of the solder ball on the common perpendicular plane, and a projection of the second extending portion on the common perpendicular plane is at least partially overlapped with the projection of the solder ball on the common perpendicular plane.

3. The electrical connector according to claim 1, wherein the first hook and the second hook each have a hooking point for hooking the periphery of the solder ball under the horizontal center line of the solder ball, and a line connecting the two hooking points just passes through the vertical center line of the solder ball.

4. The electrical connector according to claim 1, wherein the first hook and the second hook are located in different vertical planes, and the first hook and the second hook extend in parallel relatively.

5. The electrical connector according to claim 1, wherein the supporting arm has a leaning point contacting with the solder ball.

6. The electrical connector according to claim 1, wherein the receiving hole has a reserved space therein, and the reserved space receives the supporting arm when the solder ball enters between the first hook and the second hook and stretches the supporting arm.

7. The electrical connector according to claim 1, wherein a stopping portion extends laterally from a lower end of the base, and the stopping portion is located above the solder ball.

8. The electrical connector according to claim 7, wherein the stopping portion is perpendicular to a plane of the base.

9. The electrical connector according to claim 7, wherein the stopping portion is located between the first extending portion and the second extending portion.

* * * * *